United States Patent
Kim et al.

(10) Patent No.: US 8,388,399 B2
(45) Date of Patent: Mar. 5, 2013

(54) METHOD OF MANUFACTURING ORGANIC LIGHT-EMITTING DISPLAY APPARATUS

(75) Inventors: Dong-Sul Kim, Yongin (KR); Jae-Seok Park, Yongin (KR); Cheol-Lae Roh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/213,006

(22) Filed: Aug. 18, 2011

(65) Prior Publication Data

US 2012/0270461 A1 Oct. 25, 2012

(30) Foreign Application Priority Data

Apr. 20, 2011 (KR) .................. 10-2011-0036845

(51) Int. Cl.
*H01J 9/00* (2006.01)
*H01J 17/49* (2006.01)
*H01J 1/62* (2006.01)
*H01J 63/04* (2006.01)

(52) U.S. Cl. .................. 445/25; 445/24; 445/1; 445/22; 445/23; 313/483

(58) Field of Classification Search .................. None
See application file for complete search history.

(56) References Cited

U.S. PATENT DOCUMENTS

| | | | |
|---|---|---|---|
| 7,837,822 B2 * | 11/2010 | Chin et al. .................. | 156/272.8 |
| 8,169,140 B2 * | 5/2012 | Han .............................. | 313/512 |
| 2006/0082640 A1 | 4/2006 | Chin et al. | |

FOREIGN PATENT DOCUMENTS

| | | |
|---|---|---|
| KR | 10-2009-0020033 | 3/2006 |
| KR | 10-2006-0033554 | 4/2006 |
| KR | 10-2006-0042773 | 5/2006 |
| KR | 10-2007-0057066 | 6/2007 |
| KR | 10-2007-0097181 | 10/2007 |
| KR | 10-2007-0102299 | 10/2007 |

* cited by examiner

*Primary Examiner* — Natalie Walford
(74) *Attorney, Agent, or Firm* — Christie, Parker & Hale, LLP

(57) ABSTRACT

A method of manufacturing an organic light-emitting display apparatus according to a laser-induced thermal imaging (LITI) method, the method including patterning a transfer layer arranged on a donor film; disposing the donor film on an acceptor substrate; laminating the donor film on the acceptor substrate; transferring the transfer layer of the donor film to the acceptor substrate; and removing the donor film from the acceptor substrate.

17 Claims, 10 Drawing Sheets

METHOD OF MANUFACTURING ORGANIC LIGHT-EMITTING DISPLAY APPARATUS

CROSS-REFERENCE TO RELATED APPLICATION

This application claims priority to and the benefit of Korean Patent Application No. 10-2011-0036845, filed on Apr. 20, 2011 in the Korean Intellectual Property Office, the entire content of which is incorporated herein by reference.

BACKGROUND

1. Field

Aspects of embodiments of the present invention relate to a method of manufacturing an organic light-emitting display apparatus.

2. Description of the Related Art

Among flat panel display devices, an organic light-emitting device includes an anode electrode, a cathode electrode, and an intermediate layer including at least one organic emission layer (EML) interposed between the anode electrode and the cathode electrode. The organic light-emitting device is expected to become a next-generation display apparatus due to its wide viewing angle, high contrast, and fast response speeds. The organic light-emitting device may further include, in addition to the organic EML, at least one organic layer among a hole injection layer (HIL), a hole transport layer (HTL), an electron transport layer (ETL), and an electron injection layer (EIL), depending on whether an EML is formed of a polymer organic material or a low-molecular material.

In order to realize a full-color organic light-emitting device, it is necessary to perform patterning on the EML. In a case of a low-molecular organic light-emitting device, a patterning method may include a method using a shadow mask, and in a case of a polymer organic material, a patterning method may include an inkjet printing method or a laser-induced thermal imaging (LITI) method. The LITI method is advantageous in that the LITI method may minutely pattern the EML, may be used in a large area, and may realize a high resolution.

SUMMARY

According to an aspect of embodiments of the present invention, a method of manufacturing an organic light-emitting device reduces a defect occurrence ratio due to deterioration in uniformity of quality of a donor film used to transfer an emission layer (EML).

According to another aspect of embodiments of the present invention, a method of manufacturing an organic light-emitting device lessens a limitation in an EML lamination and transfer process and reduces a defect occurrence ratio due to incorrect transferring.

According to an embodiment of the present invention, a method of manufacturing an organic light-emitting display apparatus according to a laser-induced thermal imaging (LITI) method includes: patterning a transfer layer arranged on a donor film; disposing the donor film on an acceptor substrate; laminating the donor film on the acceptor substrate; transferring the transfer layer of the donor film to the acceptor substrate; and removing the donor film from the acceptor substrate.

The patterning may include removing a non-pattern portion of the transfer layer using a laser.

The method may further include, before the patterning: disposing the donor film on a supporting plate; and aiming the laser with respect to a first alignment mark arranged on the supporting plate.

The method may further include aligning a second alignment mark arranged on the supporting plate and a third alignment mark arranged on the acceptor substrate.

The second alignment mark may be a hole that is formed in the supporting plate to be aligned with the third alignment mark, and the third alignment mark may be a mark that is observable through the hole.

Disposing the donor film on the acceptor substrate may include aligning the supporting plate and the acceptor substrate by detecting the third alignment mark through the hole.

Disposing the donor film on the acceptor substrate may further include aligning the supporting plate and the acceptor substrate by emitting a light toward the third alignment mark from a side of the acceptor substrate opposite the donor film.

Before the laminating, the method may further include inserting a fixing member that penetrates respective portions of the donor film and the acceptor substrate.

Inserting the fixing member may include disposing a supporting member including a penetration hole on the donor film; and inserting a penetrating member into the penetration hole of the supporting member and the respective portions of the donor film and the acceptor substrate.

The method may further include, before the removing the donor film from the acceptor substrate, removing the fixing member from the donor film and the acceptor substrate.

The laser may have a wavelength band of 180 nm to 355 nm.

The donor film may be resistant to the wavelength band of the laser.

The laminating may further include applying a pressure to the donor film in a direction toward the acceptor substrate.

The transferring may include transferring the transfer layer to the acceptor substrate by irradiating a laser to the donor film.

The transfer layer may include one or more layers selected from the group consisting of a hole injection layer (HIL), a hole transport layer (HTL), an electroluminescent layer, a hole suppression layer, an electron transport layer (ETL), and an electron injection layer (EIL).

The acceptor substrate may include a thin-film transistor (TFT) and an electrode, and the transferring may include transferring the transfer layer of the donor film to the electrode.

The acceptor substrate may further include a pixel-defining layer (PDL) having an opening in a region corresponding to the electrode, and the patterning may include patterning the transfer layer, whereby the transfer layer remains only in a region corresponding to the opening.

BRIEF DESCRIPTION OF THE DRAWINGS

The above and other features and aspects of embodiments of the present invention will become more apparent by describing in detail some exemplary embodiments thereof with reference to the attached drawings, in which.

DETAILED DESCRIPTION

In the following detailed description, some exemplary embodiments of the present invention are shown and described, by way of illustration. As those skilled in the art would realize, the described embodiments may be modified in various different ways, all without departing from the spirit or scope of the present invention. Accordingly, the drawings and description are to be regarded as illustrative in nature and not restrictive.

As used herein, the term "and/or" includes any and all combinations of one or more of the associated listed items.

Figure 1:
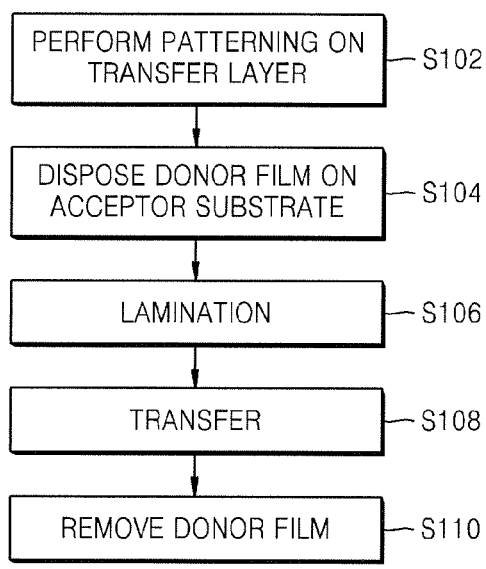
FIG. 1 is a flowchart of a method of manufacturing an organic light-emitting display apparatus, according to an embodiment of the present invention.

FIG. 1 is a flowchart of a method of manufacturing an organic light-emitting display apparatus, according to an embodiment of the present invention.

In a thermal transferring method for transferring an emission layer (EML), the EML may be transferred to an acceptor substrate by using a donor film, wherein a thin-film transistor (TFT), an electrode, or the like are formed on the acceptor substrate. According to one or more embodiments of the present invention, before the donor film is disposed on the acceptor substrate so as to transfer the EML by using the donor film, a transfer layer of the donor film, which includes a material for forming the EML, is patterned, and then the donor film is disposed on the acceptor substrate and the transfer layer is transferred.

According to an embodiment of the present invention, a transfer layer on a donor film is patterned (operation S102).

Figure 2:
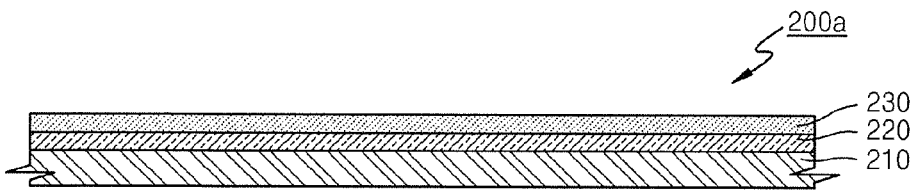
FIG. 2 is a schematic sectional view showing a structure of a donor film according to an embodiment of the present invention.

FIG. 2 is a schematic sectional view showing a structure of a donor film 200a according to an embodiment of the present invention. The donor film 200a, in one embodiment, includes a base film 210, a photothermal conversion layer 220, and a transfer layer 230, and has predetermined elasticity. The base film 210 may be formed of a transparent polymer organic material, such as polyethylene terephthalate (PET), polyethylene naphthalate (PEN), polyethylene (PE), polycarbonate (PC), and the like. The photothermal conversion layer 220 functions to convert incident light into heat. The photothermal conversion layer 220 may include aluminum oxide, aluminum sulfide, carbon black, graphite, or an infrared dye, which are light-absorbing materials. The transfer layer 230 includes a material to be transferred to an acceptor substrate. According to one embodiment, the transfer layer 230 may be an organic transfer layer. Further, the transfer layer 230 may include one or more of a hole injection layer (HIL), a hole transport layer (HTL), an electroluminescent layer, a hole suppression layer, an electron transport layer (ETL), and an electron injection layer (EIL). An EML may be formed on the acceptor substrate by having the transfer layer 230 transferred thereto.

Figure 3:
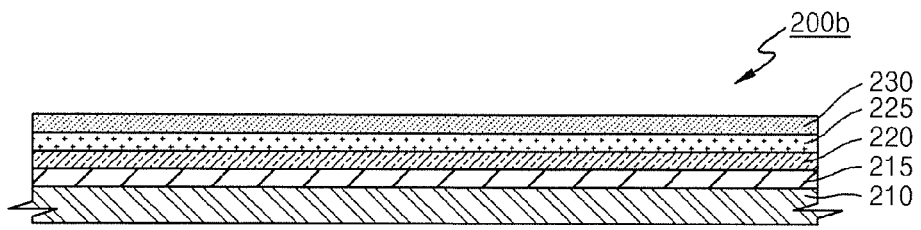
FIG. 3 is a schematic sectional view showing a structure of a donor film according to another embodiment of the present invention.

FIG. 3 is a schematic sectional view showing a structure of a donor film 200b according to another embodiment of the present invention. The donor film 200b, in one embodiment, includes the base film 210, a first buffer layer 215, the photothermal conversion layer 220, a second buffer layer 225, and the transfer layer 230. The first buffer layer 215 is interposed between the base film 210 and the photothermal conversion layer 220, thereby reinforcing adhesion between the base film 210 and the photothermal conversion layer 220. The second buffer layer 225 is interposed between the photothermal conversion layer 220 and the transfer layer 230, thereby protecting the photothermal conversion layer 220.

According to the embodiments of FIGS. 2 and 3, since a laser is directly irradiated to perform a patterning operation on the transfer layer 230 of the donor films 200a and 200b, only the transfer layer 230 needs to be removed, and the donor films 200a and 200b are not damaged when the patterning operation is performed. Thus, in order not to be damaged by a laser used to remove the transfer layer 230, the donor films 200a and 200b according to the embodiments of FIGS. 2 and 3 are formed of a material having resistance to a wavelength band of the laser. That is, in one embodiment, when an ultraviolet (UV) laser is used to remove the transfer layer 230, portions of the donor films 200a and 200b other than the transfer layer 230 are formed of an anti-UV material.

However, embodiments of the present invention are not limited to the structures of the donor films 200a and 200b shown in FIGS. 2 and 3. For convenience of description, a donor film 200 is referred to below, which may be any donor film of the present invention, such as one of the donor films 200a and 200b, including at least the base film 210 and the transfer layer 230.

Figure 4:
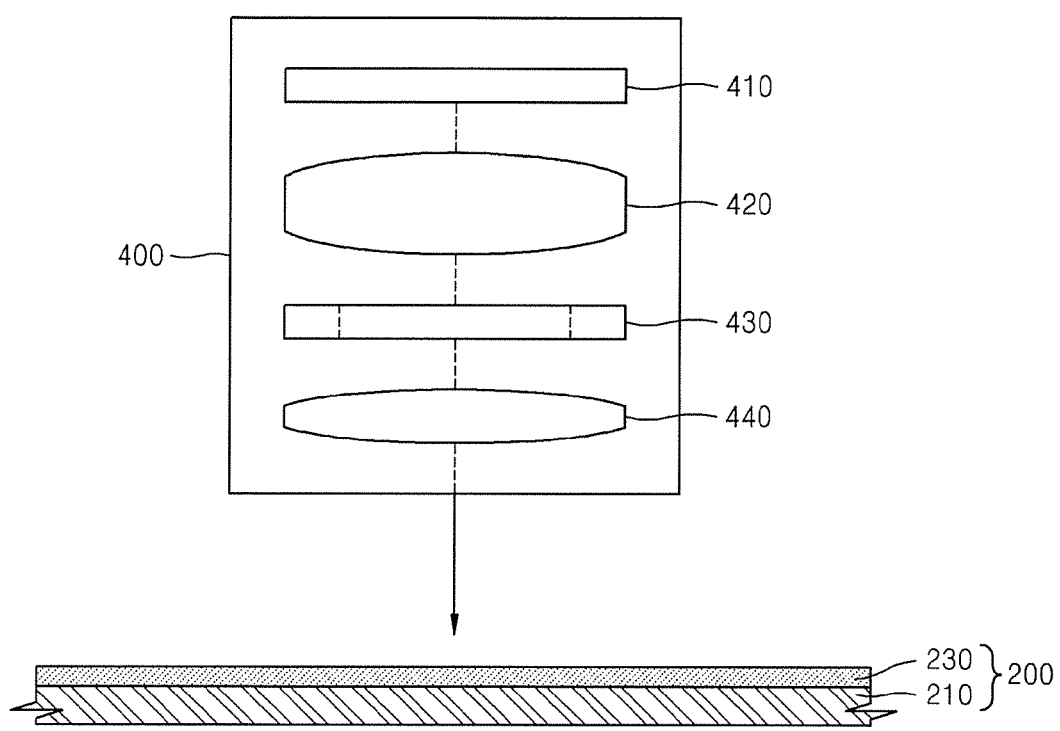
FIG. 4 is a schematic diagram illustrating a process of patterning a transfer layer, according to an embodiment of the present invention.

FIG. 4 is a schematic diagram illustrating a process of patterning the transfer layer 230, according to an embodiment of the present invention. According to one embodiment, a non-pattern portion of the transfer layer 230 is removed by using laser irradiation equipment 400.

The laser irradiation equipment 400, in one embodiment, may include a laser source 410, a beam shaping element 420, a mask 430, and a projection lens 440. In one embodiment, a beam that is generated by the laser source 410 passes through the beam shaping element 420 and is shaped as a beam having a homogenized flat-top profile. The homogenized beam may pass through the mask 430. The mask 430 may include at least one light-transmission pattern or at least one light-reflection pattern, and the beam passing through the mask 430 is irradiated on the transfer layer 230 via the projection lens 440. However, embodiments of the present invention are not limited to the configuration of the laser irradiation equipment 400 described above.

A laser provided by the laser irradiation equipment 400 has a wavelength band suitable for removing the non-pattern portion. According to one embodiment, the laser irradiation equipment 400 may provide a UV laser in the range of 150 nm to 700 nm. According to another embodiment, the laser irradiation equipment 400 may provide a UV laser in the range of 180 nm to 355 nm.

Figure 5:
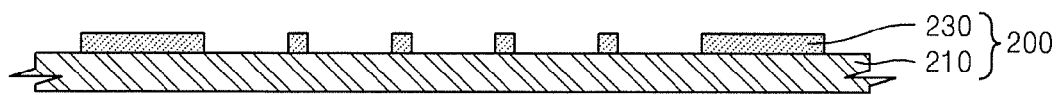
FIG. 5 is a schematic sectional view showing a transfer layer having a non-pattern portion removed, according to an embodiment of the present invention.

After a non-pattern portion of the transfer layer 230 is removed (e.g., by using the laser irradiation equipment 400), as illustrated in FIG. 5, the transfer layer 230 having a non-pattern portion removed remains on the donor film 200.

When the patterning operation on the transfer layer 230 (operation S102) is completed, the donor film 200 is disposed above an acceptor substrate 600 (operation S104). In one embodiment, the donor film 200 is disposed above the acceptor substrate 600 with a distance (e.g., a predetermined distance) therebetween, and when a position of the donor film 200 is appropriately aligned, the donor film 200 is descended so as to contact the acceptor substrate 600.

Figure 6:
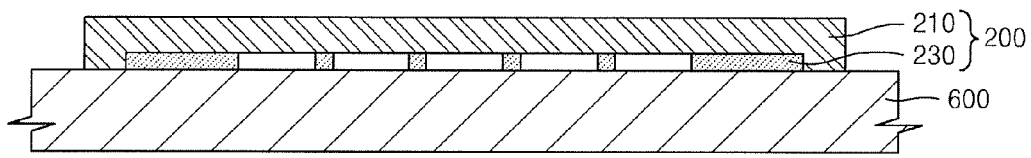
FIG. 6 is a schematic sectional view showing a donor film disposed on an acceptor substrate.

FIG. 6 is a schematic sectional view showing the donor film 200 disposed on the acceptor substrate 600. As illustrated in FIG. 6, in order to transfer the transfer layer 230 having the non-pattern portion removed to the acceptor substrate 600, the donor film 200 is disposed at a desired position on the acceptor substrate 600. In one embodiment, the donor film 200 is disposed such that the transfer layer 230 faces the acceptor substrate 600.

Figure 7:
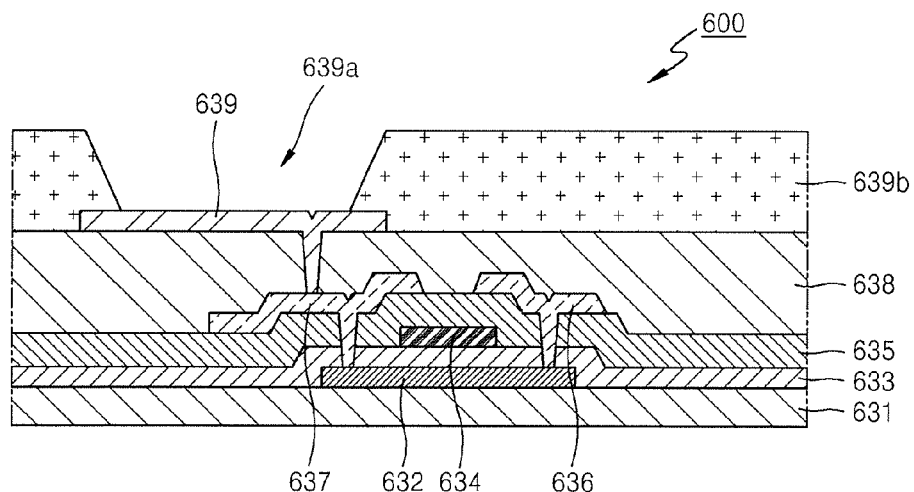
FIG. 7 is a schematic sectional view showing a structure of an acceptor substrate according to an embodiment of the present invention.

FIG. 7 is a schematic sectional view showing a structure of the acceptor substrate 600 according to an embodiment of the present invention. As illustrated in FIG. 7, in one embodiment, the acceptor substrate 600 may include a substrate 631 including an organic light-emitting device.

In one embodiment, a semiconductor layer 632 is formed on a predetermined region of the substrate 631 including the organic light-emitting device. The semiconductor layer 632 may be an amorphous silicon layer or may be a polycrystalline silicon layer formed by crystallizing an amorphous silicon layer. A gate insulating layer 633 that is a first insulating layer may be formed on the semiconductor layer 632. In one embodiment, a gate electrode 634 is formed on the gate insulating layer 633 to overlap with the semiconductor layer 632. A second insulating layer 635 may be formed on the gate electrode 634 so as to cover the semiconductor layer 632 and the gate electrode 634. A source electrode 636 and a drain electrode 637 that penetrate the second insulating layer 635 and the gate insulating layer 633 and that are respectively connected to both ends of the semiconductor layer 632 are formed on the second insulating layer 635. The semiconductor layer 632, the gate electrode 634, and the source and drain electrodes 636 and 637 constitute a thin-film transistor (TFT). A third insulating layer 638 may be formed on the source and drain electrodes 636 and 637 so as to cover the source and drain electrodes 636 and 637. The third insulating layer 638 may be a passivation layer to protect the TFT and/or a planarization layer to lessen a step difference due to the TFT. A pixel electrode 639 that penetrates the third insulating layer 638 and that is connected to the drain electrode 637 is formed on the third insulating layer 638. For example, the pixel electrode 639 may be an indium tin oxide (ITO) layer or an indium zinc oxide (IZO) layer. A pixel-defining layer (PDL) 639*b* having an opening 639*a* for exposing a portion of the pixel electrode 639 may be formed on the pixel electrode 639 and the third insulating layer 638.

Next, the donor film 200 including the transfer layer 230 is laminated (operation S106).

Figure 8:
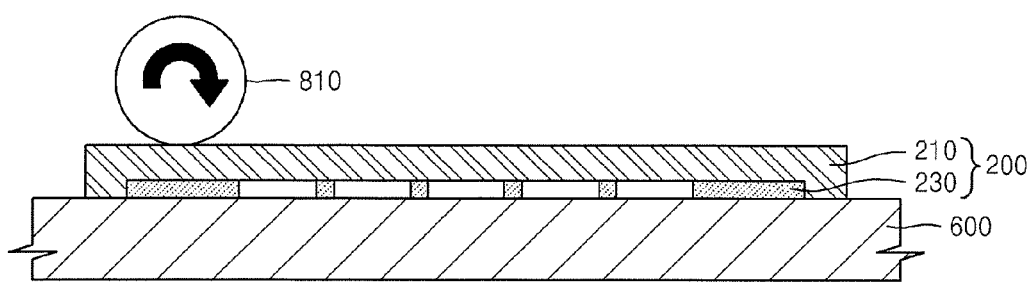
FIG. 8 is a schematic diagram illustrating a lamination process according to an embodiment of the present invention.

FIG. 8 is a schematic diagram illustrating a lamination process according to an embodiment of the present invention.

The lamination process on the transfer layer 230 may be performed by applying physical pressure to the donor film 200 and/or by placing the donor film 200 and the acceptor substrate 600 in a vacuum state to remove or substantially remove a gap between the donor film 200 and the acceptor substrate 600. According to one embodiment, as illustrated in FIG. 8, the lamination process is performed using a pressing member 810. For example, the lamination process with respect to the donor film 200 and the acceptor substrate 600 may be performed by placing the donor film 200 and the acceptor substrate 600 in a vacuum state, and then by applying physical pressure to the donor film 200 with the pressing member 810. In one embodiment, adhesion between the donor film 200 and the acceptor substrate 600 may be increased by placing the donor film 200 and the acceptor substrate 600 in a vacuum state, and then by applying physical pressure to the donor film 200 with the pressing member 810. As shown in FIG. 8, the pressing member 810, in one embodiment, may be formed as a roller.

However, the lamination process described above and depicted in FIG. 8 is only one exemplary embodiment of the present invention, and, in other embodiments of the present invention, the lamination between the donor film 200 and the acceptor substrate 600 may be performed using any other suitable laminating method.

After the lamination between the donor film 200 and the acceptor substrate 600 is completed, the transfer layer 230 of the donor film 200 is transferred to the acceptor substrate 600 (operation S108).

Figure 9:
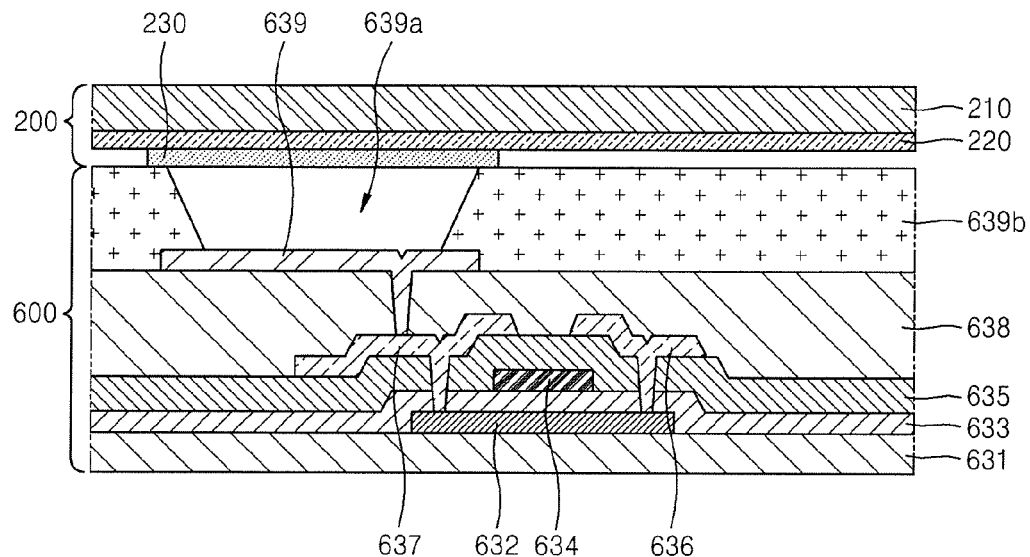
FIGS. 9 and 10 are schematic diagrams illustrating a transfer process according to an embodiment of the present invention.
Figure 10:
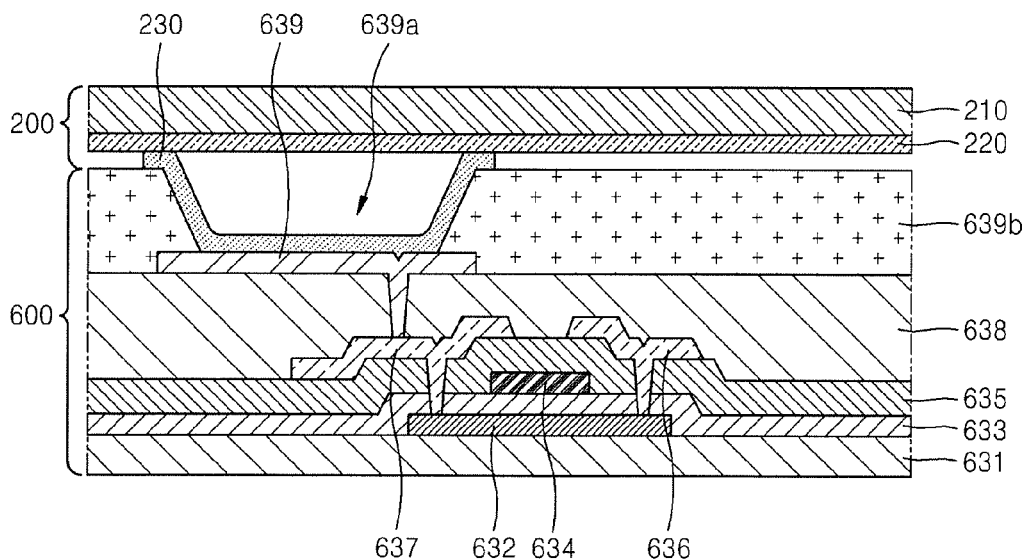

FIGS. 9 and 10 are schematic diagrams illustrating a transfer process according to an embodiment of the present invention.

As illustrated in FIG. 9, the donor film 200, including the transfer layer 230 having the non-pattern portion removed, is laminated on the acceptor substrate 600. Here, the donor film 200 is disposed on the acceptor substrate 600, such that a pattern portion of the transfer layer 230, that is, the remaining portion of the transfer layer 230, is arranged at a face of the opening 639*a* that is a region in which an EML 230' (see FIG. 11) is to be disposed.

Next, as illustrated in FIG. 10, the transfer layer 230 is transferred to the acceptor substrate 600 by using a laser or a beam. When the transfer layer 230 is transferred to the acceptor substrate 600, the transfer layer 230 constitutes the EML 230' of the acceptor substrate 600. In one embodiment, when the laser is irradiated on the donor film 200, the photothermal conversion layer 220 expands toward the acceptor substrate 600 and then the transfer layer 230 also expands, so that the transfer layer 230 of a region whereon the laser is irradiated may be separated from the donor film 200 and transferred to the acceptor substrate 600.

After the transfer layer 230 is transferred to the acceptor substrate 600 (operation S108), the portion of the donor film 200 other than the transfer layer 230 is removed (operation S110).

Figure 11:
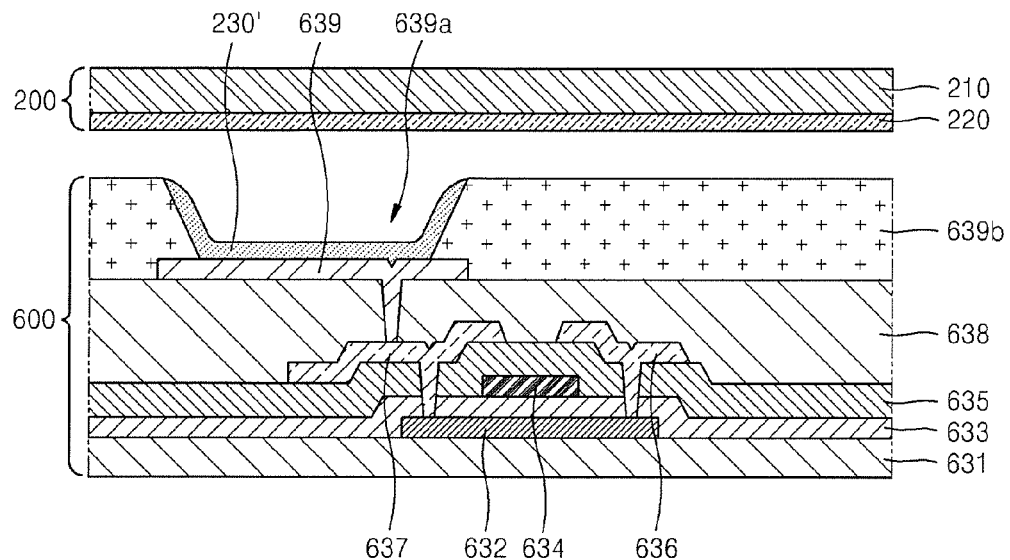
FIG. 11 is a schematic diagram illustrating a process of removing the donor film, according to an embodiment of the present invention.

FIG. 11 is a schematic diagram illustrating a process of removing the donor film 200, according to an embodiment of the present invention. After the transfer layer 230 is transferred to the acceptor substrate 600, the donor film 200 is removed, or separated, from the acceptor substrate 600, as illustrated in FIG. 11. By doing so, the EML 230', which is the transferred transfer layer 230, is formed on the pixel electrode 639 in the opening 639a of the acceptor substrate 600, and since the transfer layer 230 is separated from the donor film 200, the remaining portions of the donor film 200, excluding the separated transfer layer 230, remain on the donor film 200.

Figure 12:
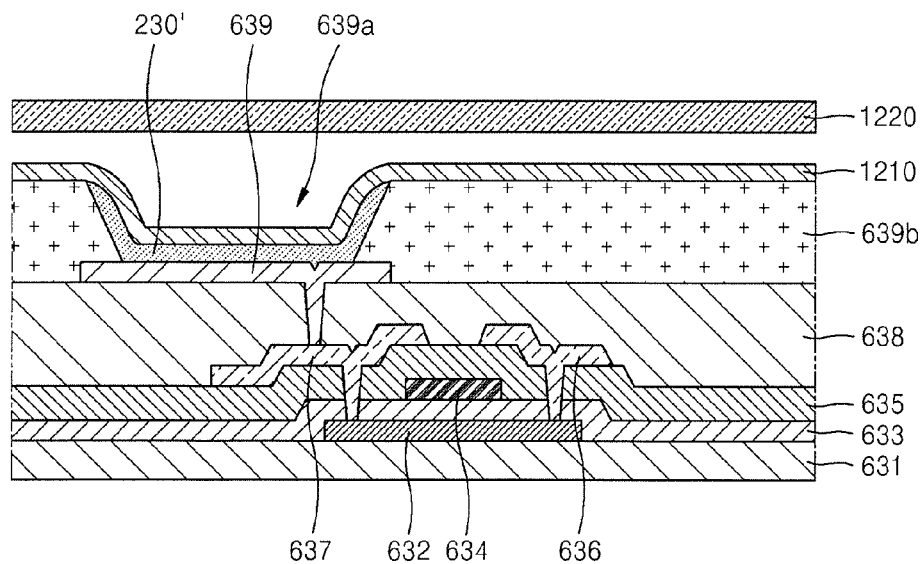
FIG. 12 is a schematic sectional view showing a structure of an organic light-emitting display apparatus after a transfer process, according to an embodiment of the present invention.

When the donor film 200 is removed from the acceptor substrate 600, as illustrated in FIG. 12, a second electrode layer 1210 is formed on the EML 230', and an encapsulation layer 1220 is formed to protect the organic light-emitting device.

Figure 13:
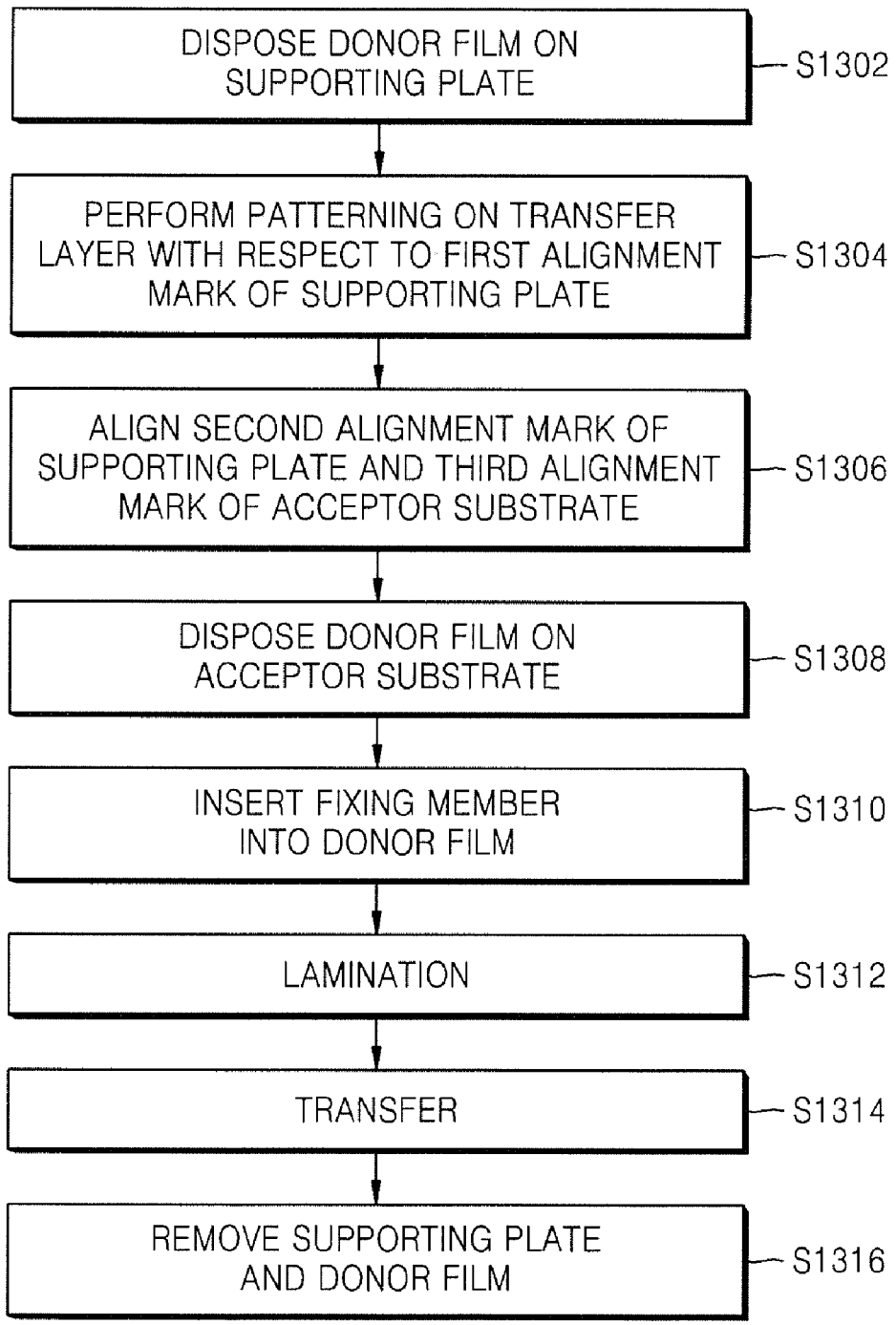
FIG. 13 is a flowchart of a method of manufacturing an organic light-emitting display apparatus, according to another embodiment of the present invention.

FIG. 13 is a flowchart of a method of manufacturing an organic light-emitting device, according to another embodiment of the present invention. According to one embodiment, an alignment mark is used to align the donor film 200 having the non-pattern portion removed, and the acceptor substrate 600.

Figure 14:
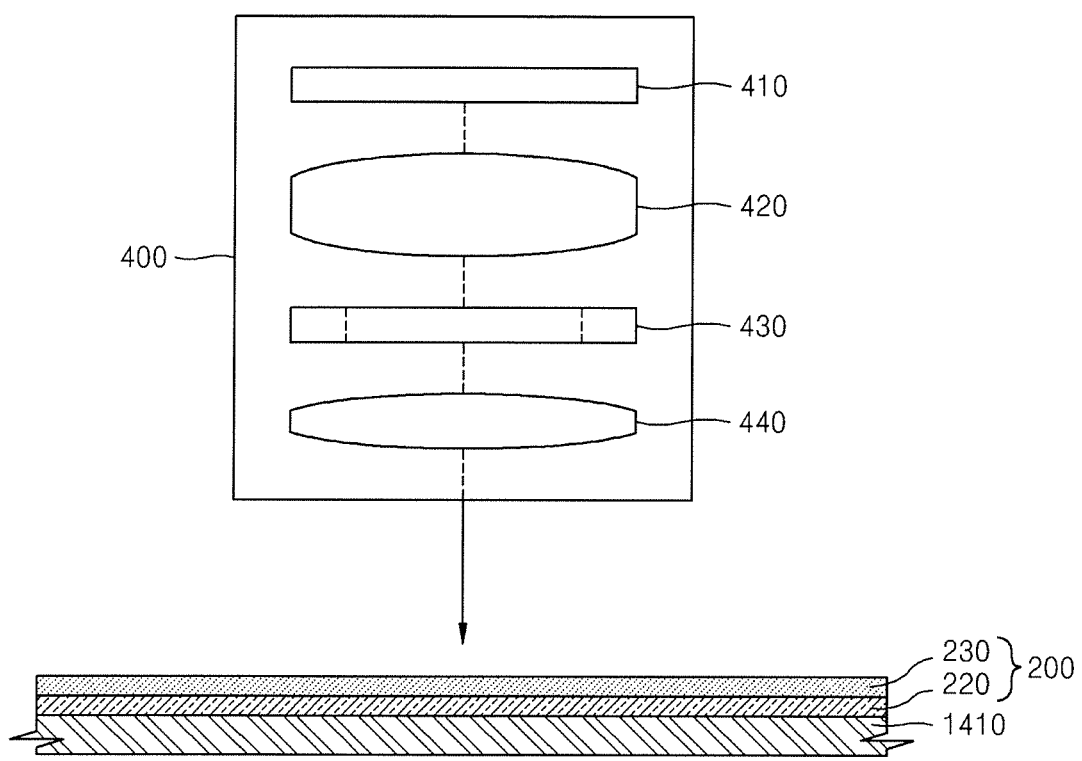
FIG. 14 is a schematic diagram showing a donor film disposed on a supporting plate, according to an embodiment of the present invention.

According to one embodiment, as illustrated in FIG. 14, the donor film 200 is disposed on a supporting plate 1410 (operation S1302). The supporting plate 1410 includes a first alignment mark 1510 (see FIG. 15) used to align the supporting plate 1410 and the laser irradiation equipment 400.

Figure 15:
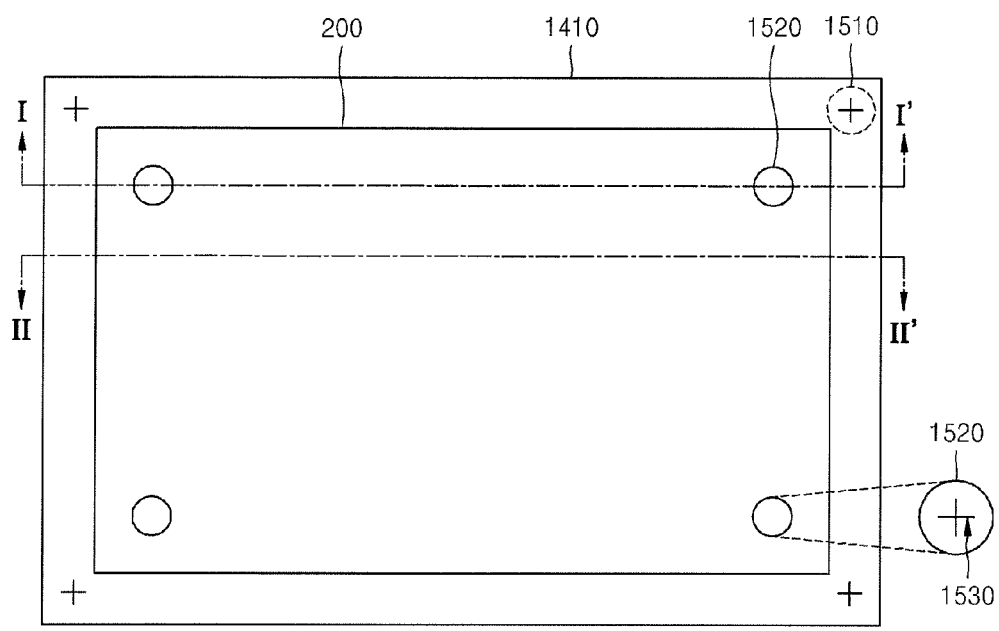
FIG. 15 is a schematic top view of a supporting plate, a donor film, and first through third alignment marks, according to an embodiment of the present invention.

FIG. 15 is a schematic top view of the supporting plate 1410 and first, second, and third alignment marks 1510, 1520, and 1530, according to an embodiment of the present invention. One or more of the first, second, and third alignment marks 1510, 1520, and 1530 may include a plurality of the respective first, second, and/or third alignment marks 1510, 1520, and 1530.

According to one embodiment, the first alignment mark 1510 is arranged on a surface of the supporting plate 1410, which faces the laser irradiation equipment 400. When the laser irradiation equipment 400 irradiates a laser to the donor film 200 on the supporting plate 1410, the first alignment mark 1510 provides a reference point to the laser irradiation equipment 400. In one embodiment, when the laser irradiation equipment 400 irradiates the laser to the donor film 200 for a patterning operation, the laser irradiation equipment 400 aims, or aligns, the laser with respect to the first alignment mark 1510. The first alignment mark 1510 may be formed on the surface of the supporting plate 1410, which faces the laser irradiation equipment 400, as a marker to be detected by the laser irradiation equipment 400.

In one embodiment, when the donor film 200 is disposed on the supporting plate 1410, the laser irradiation equipment 400 adjusts a laser irradiation position with respect to the first alignment mark 1510, irradiates the laser on the transfer layer 230 of the donor film 200, and then performs a patterning operation on the transfer layer 230 of the donor film 200 (operation S1304).

Next, the second alignment mark 1520 of the supporting plate 1410 and the third alignment mark 1530 of the acceptor substrate 600 are aligned (operation S1306). As illustrated in FIG. 15, the second alignment mark 1520 may be formed as a hole in the supporting plate 1410, and the third alignment mark 1530 may be formed as a mark on the acceptor substrate 600.

Figure 16:
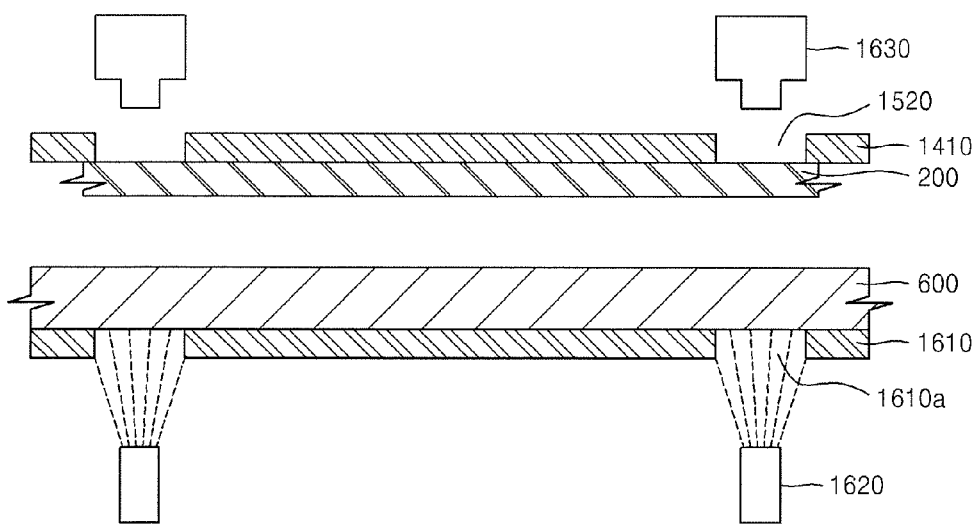
FIG. 16 is a cross-sectional view of a donor film and an acceptor substrate, taken along the line I-I' of FIG. 15.

FIG. 16 is a cross-sectional view of the donor film 200 and the acceptor substrate 600, taken along the line I-I' of FIG. 15.

As illustrated in FIG. 16, the third alignment mark 1530 (see FIG. 15) on the acceptor substrate 600 is observed via the second alignment mark 1520 of the supporting plate 1410, so that the supporting plate 1410 and the acceptor substrate 600 are aligned. Here, in order to improve visibility of the third alignment mark 1530 of the acceptor substrate 600, a stage 1610 whereon the acceptor substrate 600 is arranged may have a hole 1610a at a position at which the third alignment mark 1530 is disposed, and light may be emitted to the third alignment mark 1530 through the hole 1610a of the stage 1610. In one embodiment, a lighting member 1620 may be arranged below the stage 1610 to emit the light. In one embodiment, in order to view the third alignment mark 1530 via the second alignment mark 1520, a detecting unit 1630 may be arranged at a position corresponding to the second alignment mark 1520 on the supporting plate 1410. The detecting unit 1630 is an apparatus capable of detecting the second alignment mark 1520, and in one embodiment, for example, the detecting unit 1630 may be a photographing apparatus including an imaging device.

When the donor film 200 is aligned on the acceptor substrate 600 (operation S1306), the donor film 200 is disposed on the acceptor substrate 600 so as to allow the transfer layer 230 of the donor film 200 to contact the acceptor substrate 600 (operation S1308).

In one embodiment, a fixing member 1700 is inserted into the supporting plate 1410 and the donor film 200 to fix the donor film 200 and the acceptor substrate 600 (operation S1310).

Figure 17:
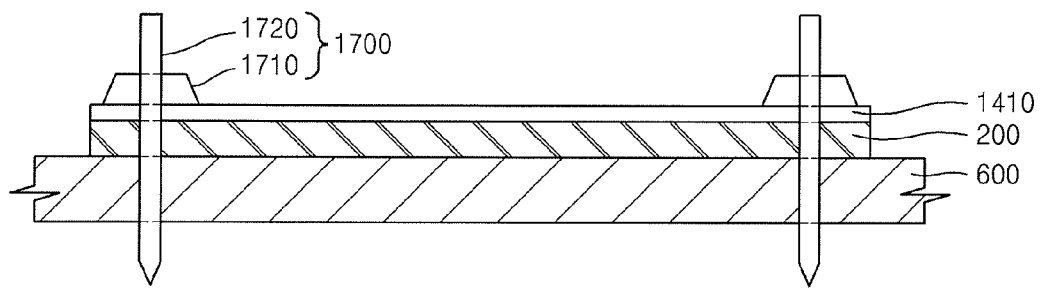
FIG. 17 is a cross-sectional view of the donor film and the acceptor substrate, taken along the line II-II' of FIG. 15.

FIG. 17 is a cross-sectional view of the donor film 200 and the acceptor substrate 600, taken along the line II-II' of FIG. 15.

Figure 18:
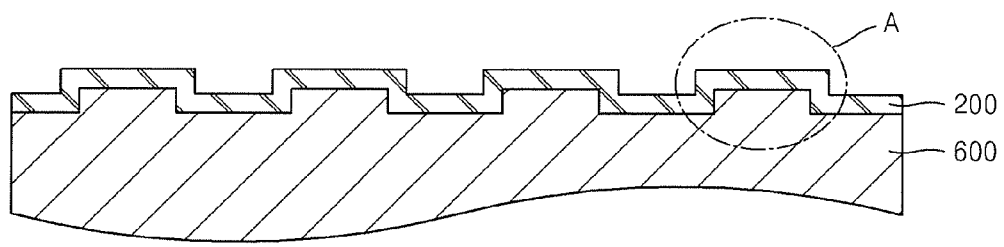
FIGS. 18 and 19 are schematic diagrams illustrating an effect according to one or more embodiments of the present invention.
Figure 19:
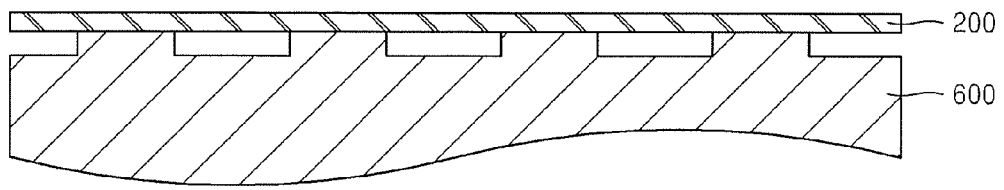

Referring to FIG. 17, in order to prevent or substantially prevent the donor film 200 from being deformed by an unevenness of the acceptor substrate 600 while a lamination process is performed, the fixing member 1700 is inserted into portions of the donor film 200 and the acceptor substrate 600, and thus, the donor film 200 is fixed on the acceptor substrate 600. As illustrated in FIG. 18, due to unevenness of the acceptor substrate 600, the donor film 200 may be deformed by the unevenness of the acceptor substrate 600 while the lamination process is performed (see region "A"). However, as illustrated in FIG. 19, according to an embodiment of the present invention, the donor film 200 remains taut by using the fixing member 1700. The fixing member 1700 may be inserted in the acceptor substrate 600 to a depth (e.g., a predetermined depth), and as illustrated in FIG. 17, the fixing member 1700 may penetrate the acceptor substrate 600.

According to one embodiment, by inserting the fixing member 1700, the alignment of the donor film 200 and the acceptor substrate 600 is maintained during the lamination process and the transfer process, and deformation of the donor film 200 due to unevenness of the acceptor substrate 600 is prevented or substantially prevented, such that an accuracy of the transfer process may be increased. Also, since the donor film 200 remains taut during the transfer process, the transfer layer 230 may be transferred having a uniform height to the acceptor substrate 600.

Figure 20:
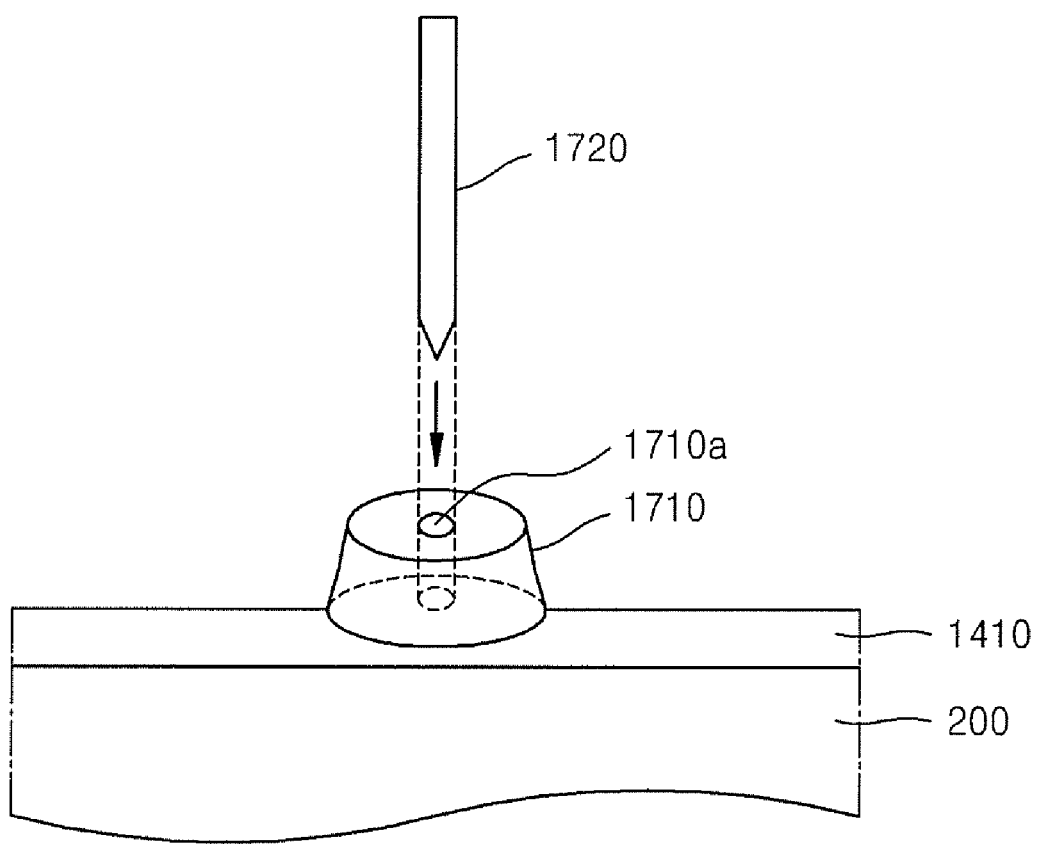
FIG. 20 is a schematic perspective view of a structure of a fixing member according to an embodiment of the present invention.

FIG. 20 is a schematic perspective view of a structure of the fixing member 1700 according to an embodiment of the present invention. The fixing member 1700, in one embodiment, includes a supporting member 1710 and a penetrating member 1720. The supporting member 1710 is disposed on the supporting plate 1410. The supporting member 1710 may include a penetration hole 1710a for receiving the penetrating member 1720. The supporting member 1710 may be formed of a material having elasticity so as to prevent or substantially prevent accidental removal of the penetrating member 1720 from the penetration hole 1710*a*. Also, the supporting member 1710 may be formed of a material that is resistant to slippage on the supporting plate 1410, so as not to slip on the supporting plate 1410. As illustrated in FIG. 17, the penetrating member 1720 penetrates the supporting plate 1410 and the donor film 200 through the penetration hole 1710*a* of the supporting member 1710.

In one embodiment, after the fixing member 1700 is inserted into the donor film 200 (operation S1310), the donor film 200 and the acceptor substrate 600 are laminated (operation S1312), and the transfer layer 230 of the donor film 200 is transferred to the acceptor substrate 600 by using a laser, thermal energy, a beam, or the like (operation S1314). After the transfer layer 230 is transferred (operation S1314), the fixing member 1700 is removed from the donor film 200 and the acceptor substrate 600, and the supporting plate 1410 and the donor film 200 are removed from the acceptor substrate 600 (operation S1316).

According to one embodiment, both the supporting plate 1410 and the donor film 200 are removed, but in another embodiment, after the donor film 200 is disposed on the acceptor substrate 600, the supporting plate 1410 may be separated from the donor film 200 before the fixing member 1700 is inserted. Combination and separation of the supporting plate 1410 and the donor film 200 may be performed using any suitable method.

In contrast to embodiments of the present invention, if a transfer layer is patterned after a donor film is disposed on an acceptor substrate, a lamination condition may be complicated. For example, if a quality of a donor film is not uniform or the lamination condition is not satisfied, defects including stains, foreign substances, scratches, pinholes, or the like may occur when a lamination process is performed. Here, a case in which the lamination condition is not satisfied indicates a state in which conditions such as heat, vacuum, and physical pressure are not satisfied, or foreign substances or the like enter during a lamination process. Also, while the lamination process is performed, if significantly strong heat, vacuum, and physical pressure are applied to the donor film, a transfer of an entire plane in which even a non-pattern portion is transferred may occur, such that the lamination condition becomes complicated. However, as described above, according to embodiments of the present invention, the patterning operation is performed before the donor film 200 is disposed on the acceptor substrate 600, and the transfer process is performed after the donor film 200 whose non-pattern portion is removed is disposed on the acceptor substrate 600, such that a quality of the transfer process is less dependent on a quality of the donor film 200, and a required lamination condition is considerably lessened. According to embodiments of the present invention, a management level with respect to the donor film 200 may be lessened to a management level with respect to foreign substances. Also, according to the one or more embodiments of the present invention, the required lamination condition is not complicated, so that an organic film transferring apparatus may be simplified, and a transfer condition may be uncomplicated.

According to the one or more embodiments of the present invention, regardless of uniformity of quality of the donor film used to transfer the EML, an EML having a desired pattern may be transferred to a substrate with a reduced defect occurrence ratio due to a lack of uniformity of quality of the donor film, and a management level with respect to the donor film may be lessened.

Also, according to the one or more embodiments of the present invention, required lamination/transfer conditions are lessened, such that occurrences of a transfer defect may be decreased, and an apparatus for lamination/transfer processes may be simplified.

Further, according to the one or more embodiments of the present invention, the required uniformity of quality of the donor film, the management level with respect to the donor film, and the required lamination/transfer conditions are lessened, such that the manufacturing costs for the organic light-emitting display apparatus may be reduced.

While the present invention has been particularly shown and described with reference to some exemplary embodiments thereof, it will be understood by those of ordinary skill in the art that various changes in form and details may be made therein without departing from the spirit and scope of the present invention as defined by the following claims and equivalents thereof.

What is claimed is:

1. A method of manufacturing an organic light-emitting display apparatus according to a laser-induced thermal imaging (LITI) method, the method comprising:
   patterning a transfer layer of a donor film, the patterning comprising removing a non-pattern portion of the transfer layer whereby a pattern portion of the transfer layer remains;
   disposing the donor film on an acceptor substrate;
   laminating the donor film on the acceptor substrate;
   transferring the pattern portion of the transfer layer of the donor film to the acceptor substrate; and
   removing the donor film from the acceptor substrate,
   wherein the patterning is performed before the disposing the donor film on the acceptor substrate.

2. The method of claim 1, wherein the patterning comprises removing the non-pattern portion of the transfer layer using a laser.

3. The method of claim 2, further comprising, before the patterning:
   disposing the donor film on a supporting plate; and
   aiming the laser with respect to a first alignment mark arranged on the supporting plate.

4. The method of claim 3, further comprising aligning a second alignment mark arranged on the supporting plate and a third alignment mark arranged on the acceptor substrate.

5. The method of claim 4,
   wherein the second alignment mark is a hole that is formed in the supporting plate to be aligned with the third alignment mark, and
   wherein the third alignment mark is a mark that is observable through the hole.

6. The method of claim 5, wherein the disposing the donor film on the acceptor substrate comprises aligning the supporting plate and the acceptor substrate by detecting the third alignment mark through the hole.

7. The method of claim 6, wherein the disposing the donor film on the acceptor substrate further comprises aligning the supporting plate and the acceptor substrate by emitting a light toward the third alignment mark from a side of the acceptor substrate opposite the donor film.

8. A method of manufacturing an organic light-emitting display apparatus according to a laser-induced thermal imaging (LITI) method, the method comprising:
   patterning a transfer layer arranged on a donor film;
   disposing the donor film on an acceptor substrate;
   laminating the donor film on the acceptor substrate;
   transferring the transfer layer of the donor film to the acceptor substrate; and removing the donor film from the acceptor substrate,
wherein the patterning comprises removing a non-pattern portion of the transfer layer using a laser, and
wherein the laser has a wavelength band of 180 nm to 355 nm.

9. The method of claim 8, wherein the donor film is resistant to the wavelength band of the laser.

10. The method of claim 1, further comprising, before the laminating, inserting a fixing member that penetrates respective portions of the donor film and the acceptor substrate.

11. The method of claim 10, wherein the inserting the fixing member comprises:
   disposing a supporting member including a penetration hole on the donor film; and
   inserting a penetrating member into the penetration hole of the supporting member and the respective portions of the donor film and the acceptor substrate.

12. The method of claim 10, further comprising, before the removing of the donor film, removing the fixing member from the donor film and the acceptor substrate.

13. The method of claim 1, wherein the laminating further comprises applying a pressure to the donor film in a direction toward the acceptor substrate.

14. The method of claim 1, wherein the transferring comprises transferring the pattern portion of the transfer layer to the acceptor substrate by irradiating a laser to the donor film.

15. The method of claim 1, wherein the transfer layer comprises one or more layers selected from the group consisting of a hole injection layer (HIL), a hole transport layer (HTL), an electroluminescent layer, a hole suppression layer, an electron transport layer (ETL), and an electron injection layer (EIL).

16. The method of claim 1,
   wherein the acceptor substrate comprises a thin-film transistor (TFT) and an electrode, and
   wherein the transferring comprises transferring the pattern portion of the transfer layer of the donor film to the electrode.

17. The method of claim 16,
   wherein the acceptor substrate further comprises a pixel-defining layer (PDL) having an opening in a region corresponding to the electrode, and
   wherein the patterning comprises patterning the transfer layer, whereby the pattern portion of the transfer layer remains only in a region corresponding to the opening.

* * * * *